United States Patent
Tanaka et al.

(10) Patent No.: US 12,075,574 B2
(45) Date of Patent: Aug. 27, 2024

(54) ELECTRONIC CONTROL DEVICE

(71) Applicant: Mitsubishi Electric Corporation, Tokyo (JP)

(72) Inventors: Takaaki Tanaka, Tokyo (JP); Fumino Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 17/365,455

(22) Filed: Jul. 1, 2021

(65) Prior Publication Data
US 2022/0322541 A1 Oct. 6, 2022

(30) Foreign Application Priority Data
Mar. 30, 2021 (JP) ................. 2021-056748

(51) Int. Cl.
*H05K 5/00* (2006.01)
*H05K 5/06* (2006.01)
*H05K 7/14* (2006.01)

(52) U.S. Cl.
CPC ........... *H05K 5/006* (2013.01); *H05K 5/0069* (2013.01); *H05K 5/062* (2013.01); *H05K 7/1405* (2013.01)

(58) Field of Classification Search
CPC ...... H05K 5/006; H05K 5/0069; H05K 5/062; H05K 7/1405
USPC ....................................................... 361/752
See application file for complete search history.

(56) References Cited

U.S. PATENT DOCUMENTS

| | | | |
|---|---|---|---|
| 2012/0320544 A1* | 12/2012 | Ohhashi | H05K 5/062 361/752 |
| 2014/0285985 A1* | 9/2014 | Tanaka | H05K 5/0069 361/752 |
| 2014/0307399 A1* | 10/2014 | Tamura | H05K 5/0039 361/752 |
| 2018/0192526 A1* | 7/2018 | Suzuki | H05K 5/0008 |
| 2019/0380220 A1* | 12/2019 | Matsuda | H01R 13/41 |
| 2020/0216050 A1* | 7/2020 | Uchida | B60T 17/04 |

FOREIGN PATENT DOCUMENTS

| | | | | |
|---|---|---|---|---|
| JP | 2014187062 A | * | 10/2014 | ............ B60T 8/368 |
| JP | 5744092 B2 | | 7/2015 | |
| JP | 6584547 B2 | | 10/2019 | |

* cited by examiner

*Primary Examiner* — Zhengfu J Feng
(74) *Attorney, Agent, or Firm* — Sughrue Mion, PLLC; Richard C. Turner

(57) ABSTRACT

An electronic control device includes: an electronic circuit board on which an electronic component is packaged; and a housing in which the electronic circuit board is contained, and which is composed of a case and a base. The electronic control device includes: a plurality of claws which is provided in the case of the housing and fixes the electronic circuit board; a fixing groove which is formed in the case on the rear side of the claws, and into which a peripheral edge portion of the base is close-fitted; a cutout which is formed on the rear side of the claws of the housing and is communicated with the fixing groove; and adhesive which is filled on the rear side of the claws via the fixing groove and the cutout.

9 Claims, 5 Drawing Sheets

ELECTRONIC CONTROL DEVICE

BACKGROUND OF THE INVENTION

1. Field of the Invention

The present application relates to an electronic control device.

2. Description of the Related Art

An electronic control device used for control of a vehicle and the like is of a structure in which electronic components, such as an input and/or output circuit, a communication circuit, a microcomputer, and a power source circuit, are generally arranged on a printed board serving as an electronic circuit board, connectors for being connected to external devices are placed on the printed board, and this printed board is contained in a housing.

Then, as this electronic control device, there is known one in which the printed board is sandwiched by means of a base and a cover, which are separated above and below, and the butt surfaces of the base and the cover are bonded by waterproof sealant and the like.

In the electronic control device configured by such an upper and lower separation type housing composed of the cover, the base, and the like, there is generally used a method in which bosses, each formed with a screw hole, are provided on either one of the cover side or the base side and the printed board is rigidly connected to the housing by screw-fastening the printed board to the screw holes to secure vibration resistance.

Furthermore, in an electronic control device used for a use which does not so require vibration resistance, there is sometimes used a method which fixes the printed board to the housing by means of claws provided on either one side of the housing.

PATENT DOCUMENT

[Patent document 1] JP,6584547,B
[Patent document 2] JP,5744092,B

For the above conventional electronic control device, although the former screw-fastening method can secure high vibration resistance as the device by rigidly connecting the printed board to the housing with screws, the screw holes need to be provided in the housing and thus it becomes expensive. Specifically, a problem exists in that screws for fastening the board and a screw-fastening process are needed, and in addition, female screws need to be formed in a fastening portion in some way, for example, a tapping process is added when the housing is made of metal and insert nuts and the like are inserted and simultaneously formed when the housing is made of resin.

Furthermore, in recent years, a choice, such as a tapping screw, has been enriched and thus the formation of the female screws is not necessarily essential for both metal housing and resin housing; however, the screws themselves remain and accordingly it is an insoluble problem that the effect on cost becomes large due to, in particular, an increase of the number of screws.

For the latter claw-fixing method, additional parts such as screws or processes such as tapping need not to be added and the printed board can be easily fixed; on the other hand, securement of vibration resistance is a problem. Structurally, the printed board is close-fitted by elastically deforming a claw portion; and if external force enough to elastically deform the claw portion (vibration, dropping impact, etc.) is applied, there is a possibility that the claw is opened and the printed board is unfastened. In particular, the securement of vibration resistance is a large problem for the electronic control device mounted in the vicinity of an engine.

BRIEF SUMMARY OF THE INVENTION

The present application is to disclose a technique for solving the problem mentioned above and is to provide an electronic control device capable of surely fixing an electronic circuit board and improving vibration resistance.

An electronic control device disclosed in the present application is an electronic control device which includes: an electronic circuit board on which an electronic component is packaged; and a housing in which the electronic circuit board is contained, and which is composed of a case and a base. The electronic control device includes: a plurality of claws which is provided on the case of the housing and fixes the electronic circuit board; a fixing groove which is formed in the case on the rear side of the claws, and into which a peripheral edge portion of the base is close-fitted; a cutout which is formed on the rear side of the claws of the housing and is communicated with the fixing groove; and adhesive which is filled on the rear side of the claws via the fixing groove and the cutout.

According to the electronic control device disclosed in the present application, the electronic circuit board can be surely fixed by the plurality of claws and vibration resistance can be improved.

The foregoing and other objects, features, aspects and advantages of the present application will become more apparent from the following detailed description of the present application when taken in conjunction with the accompanying drawings.

DETAILED DESCRIPTION OF THE INVENTION

Preferred Embodiment 1

Figure 1:
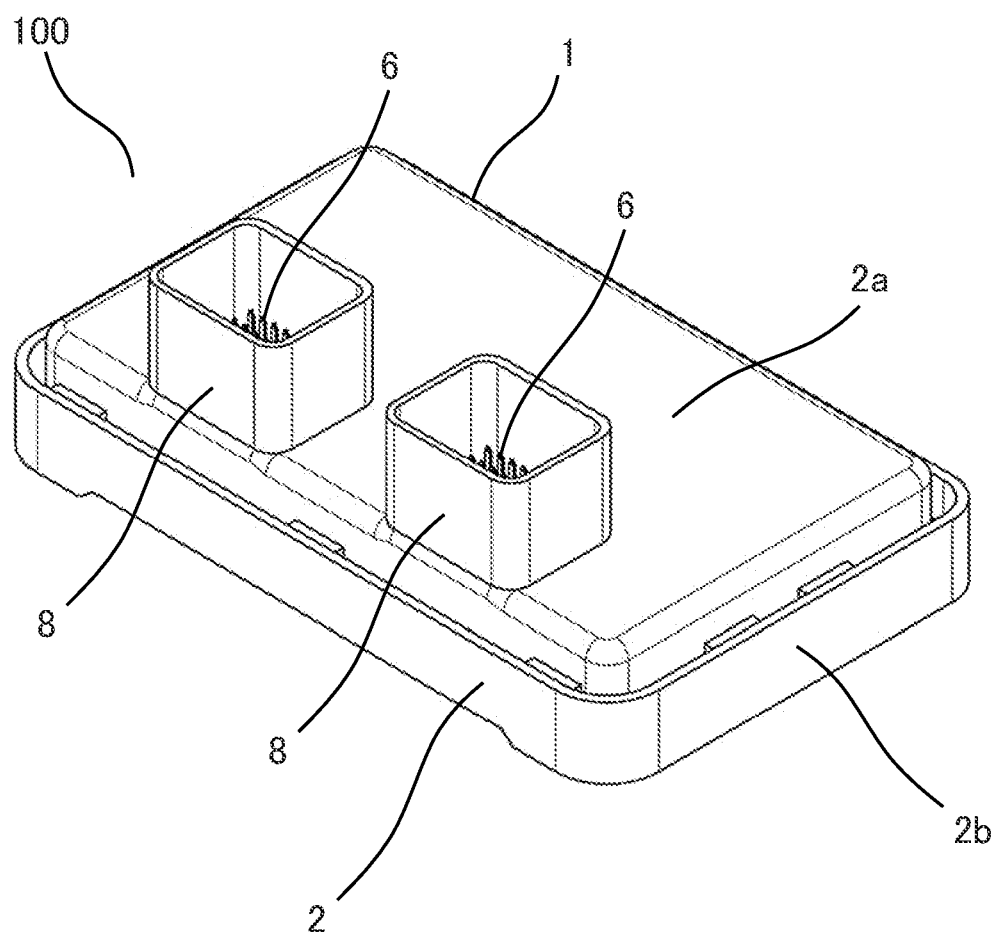
FIG. 1 is a perspective view showing an electronic control device according to a preferred embodiment 1.
Figure 2:
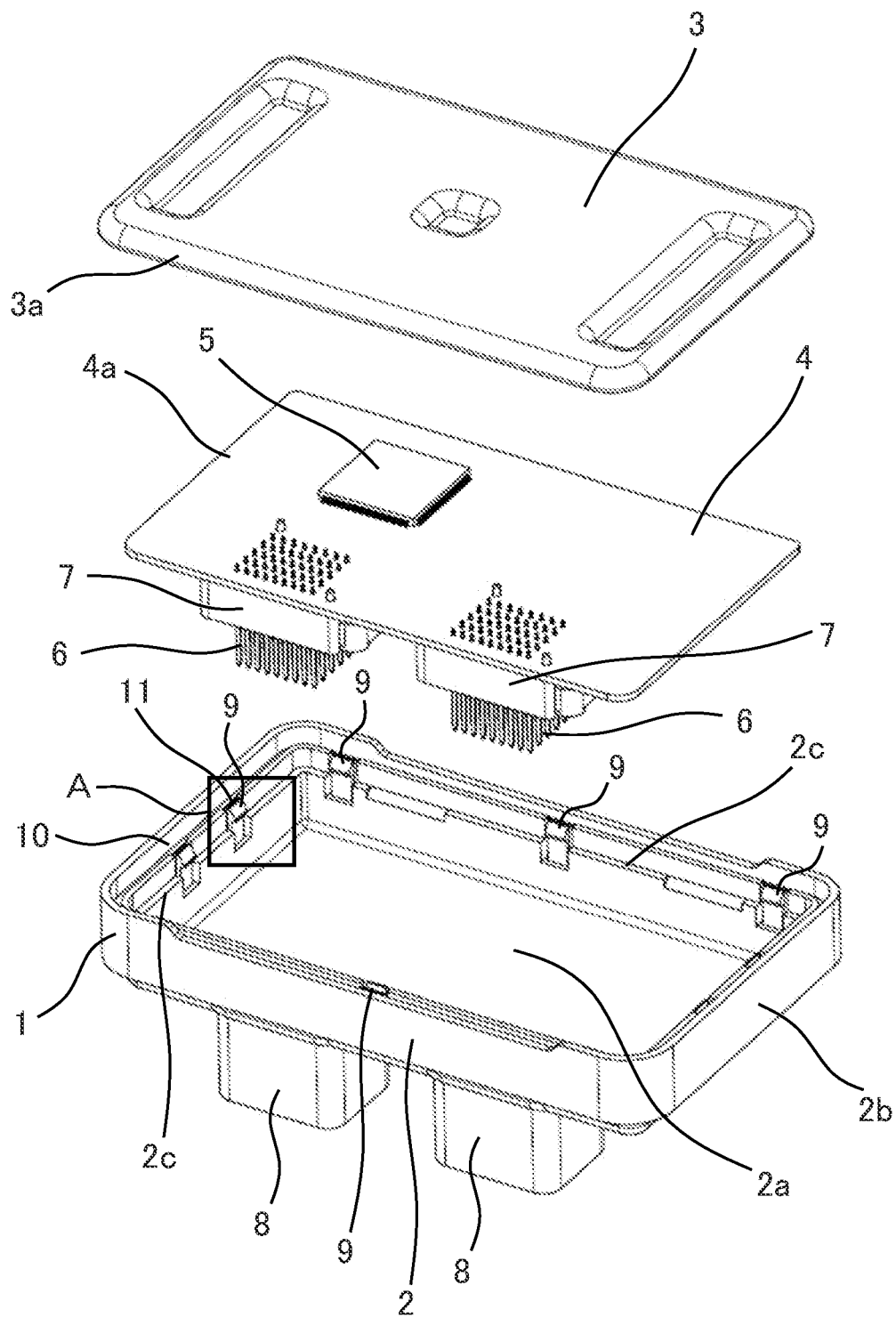
FIG. 2 is an exploded perspective view showing the electronic control device according to the embodiment 1.
Figure 3:
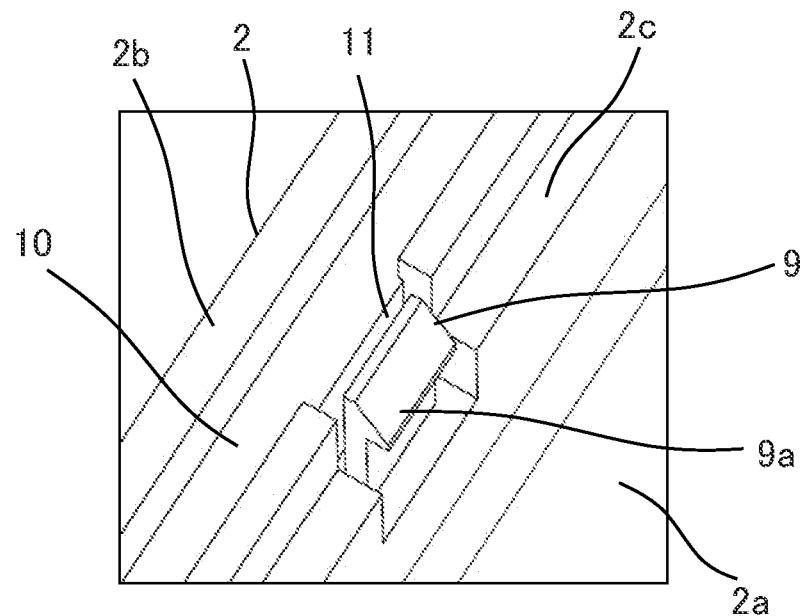
FIG. 3 is a perspective view showing a part A of FIG. 2 in the electronic control device according to the embodiment 1.
Figure 4:
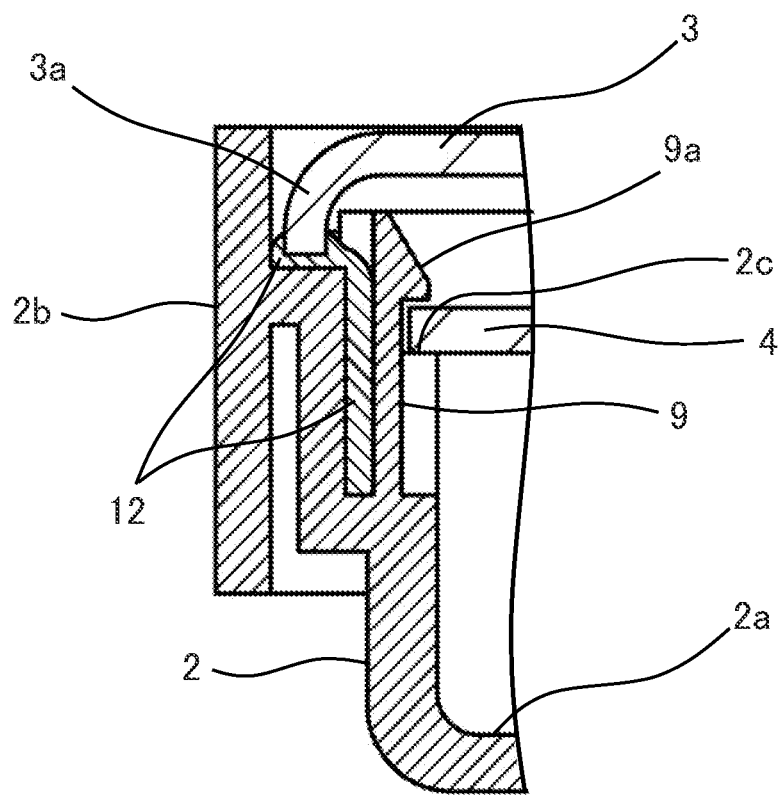
FIG. 4 is a relevant part sectional view showing the electronic control device according to the embodiment 1.

Hereinafter, a preferred embodiment 1 of the present application will be described on the basis of FIG. 1 to FIG. 4. Then, in each of the drawings, identical or equivalent members and portions will be described with the same reference numerals (and letters) assigned thereto. FIG. 1 is a perspective view showing an electronic control device according to the embodiment 1. FIG. 2 is an exploded perspective view showing the electronic control device according to the embodiment 1. FIG. 3 is a perspective view showing a part A of FIG. 2 in the electronic control device according to the embodiment 1. FIG. 4 is a relevant part sectional view showing the electronic control device according to the embodiment 1.

An electronic control device 100 is mounted on, for example, an engine of an engine room. A housing 1 is composed of a case 2 and a base 3 and is of an upper and lower separation type. The case 2 of the housing 1 is composed of a case base body 2a, a case frame body 2b, and a board mounting portion 2c. The case 2 is formed of, for example, polybutylene terephthalate (PBT) resin; and the base 3 is formed of, for example, aluminum, stainless steel, and PBT resin.

An electronic component 5 is packaged on one side of an electronic circuit board 4; and a pin header 7, which is an assembly of a plurality of connector pins 6 serving as external connection terminals, is arranged on the back side of the electronic circuit board 4. One side of the pin header 7 is inserted into through holes of the electronic circuit board 4 and is securely fastened by being connected to electrical circuits (not shown in the drawing) such as input and/or output units; and the other side thereof is protruded from an opening portion of the case 2 and is contained in a connector housing 8. Then, the pin header 7 constitutes a connector to be electrically connected to other input and/or output units (not shown in the drawing).

The electronic circuit board 4 is mounted on the board mounting portion 2c of the case 2 and is contained. A plurality of claws 9 provided in the vicinity of the board mounting portion 2c of the case 2 is for fixing a peripheral edge portion 4a of the electronic circuit board 4 to the board mounting portion 2c of the case 2. Incidentally, in a state where the claw 9 is deformed in an opening direction, it is desirable that stress generated at the base of the claw 9 is less than the tensile strength of material of which the claw 9 is made.

Furthermore, a rectangular annular shaped fixing groove 10 which is for filling adhesive is provided in the case frame body 2b of the case 2 on the rear side of the plurality of claws 9; and a peripheral edge portion 3a of the base 3 is fitted into the fixing groove 10. A cutout 11 is provided at a portion corresponding to the rear side of the plurality of claws 9 and is communicated with the fixing groove 10. For example, this embodiment 1 shows a case where the bottom surface of the fixing groove 10 and the bottom surface of the cutout 11 are located at the same level position.

FIG. 4 is a relevant part enlarged sectional view showing the periphery of the electronic circuit board 4 and the claw 9 in a completion state of the electronic control device 100. The electronic circuit board 4 is fixed by the plurality of claws 9; and adhesive 12 filled in the fixing groove 10 flows out to the rear side of the plurality of claws 9 through the cutout 11, and then the adhesive 12 is hardened to suppress the opening of the plurality of claws 9 after assembly of the electronic control device 100. Furthermore, the adhesive 12 remained in the fixing groove 10 is bonded to the peripheral edge portion 3a of the base 3 to seal the inside of the electronic control device 100 by blocking boundary surfaces.

Next, assembly procedure of the electronic control device 100 in the embodiment 1 will be described while referring to FIG. 2 to FIG. 4.

The electronic circuit board 4 on which the pin header 7, the electronic component 5, and the like are packaged, is inserted into the case frame body 2b of the case 2. At this time, the electronic circuit board 4 opens the claws 9 outward while running up onto a top portion 9a of the plurality of claws 9 and is mounted on the board mounting portion 2c of the case 2 by being inserted to the deep side; and the claws 9 opened outward return to the original position, whereby the electronic circuit board 4 is fixed to the case frame body 2b of the case 2.

Next, the adhesive 12 is filled in the fixing groove 10. As the adhesive 12, for example, silicone adhesive and the like is used. It doesn't matter whether the type of the adhesive 12 is a liquid type, or a liquid hardening type, or a room temperature hardening type, or a heat hardening type; however, it is desirable that the adhesive 12 has viscosity to such an extent that the proper amount of the adhesive 12 drips from the cutout 11 and flows out to the rear side of the claw 9 during the time until the adhesive 12 is hardened within an assembly process, and has viscosity to such an extent that the adhesive 12 does not flow off from the fixing groove 10 during the time of a general relevant assembling process (referred to as generally intermediate viscosity, a viscosity range of approximately 5 to 200 Pa·s).

After filling the adhesive 12, the base 3 is assembled to the case 2. A bonding surface top portion 3a1 of the peripheral edge portion 3a of the base 3 is fitted into the fixing groove 10 of the case 2 in which the adhesive 12 is filled, whereby the case 2 and the base 3 are bonded via the adhesive 12.

In the meantime, the adhesive 12 drips partly from the cutout 11 and flows into the rear side of the claw 9. At this time, the adhesive 12 is hardened, whereby the claw 9 is securely fastened.

As a result, the electronic circuit board 4 is fitted to the case 2 and the electronic control device 100 is assembled in a form where the electronic circuit board 4 is sealed by the base 3.

In the electronic control device using fixing means of the electronic circuit board by the plurality of claws, and in the conventional electronic control device in which the plurality of claws is not securely fastened, when external force (vibration, dropping impact, etc.) enough to elastically deform the claw is applied, there is a possibility that the claw is opened and the electronic circuit board is unfastened.

In the electronic control device 100 according to the present application, the plurality of claws 9 is securely fastened with the adhesive 12; thus, even if large external force is applied, the claw 9 is not opened. Therefore, the electronic circuit board 4 is prevented from dropping; thus, the electronic control device 100 excellent in vibration resistance or impact resistance can be obtained as compared to the conventional electronic control device.

Incidentally, in this embodiment 1, as an example, the description has been made on the electronic control device 100 of a structure which is provided with the connector housing 8 having the pin header 7 on the electronic circuit board 4 side and the opening portion through which terminals protrude on the case 2 side, and which constitutes the connector by integrating them into one body; however, needless to say, the configuration of the present application can be applied to both cases where the entire connector is configured on the electronic circuit board 4 side and is configured on the case side, and the same effect can be exhibited.

Preferred Embodiment 2

Figure 5:
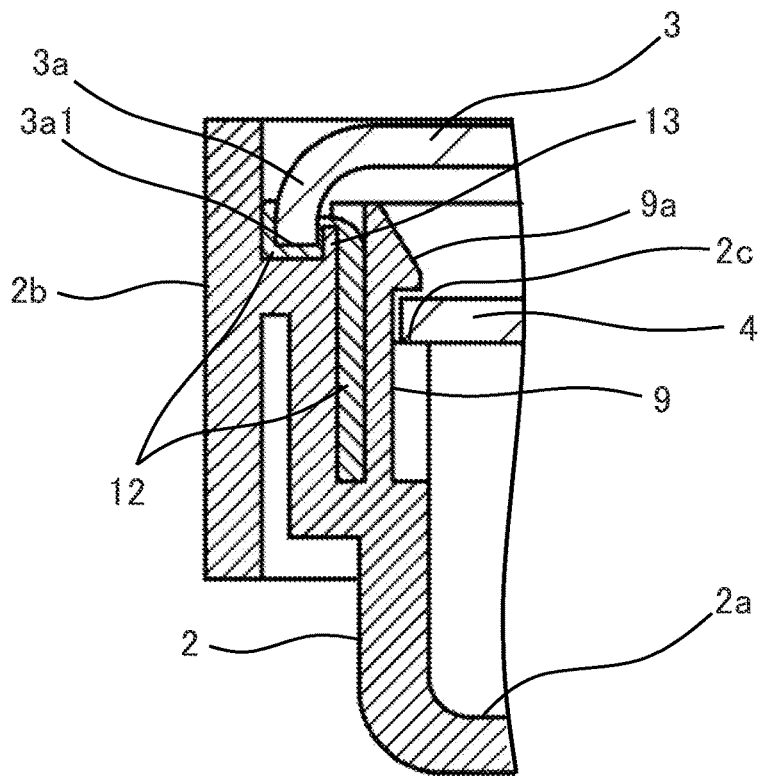
FIG. 5 is a relevant part sectional view showing an electronic control device according to a preferred embodiment 2.

FIG. 5 is a relevant part sectional view showing an electronic control device according to a preferred embodiment 2 and shows an enlarged periphery of an electronic circuit board 4 and a claw 9.

The above embodiment 1 shows the structure in which the adhesive 12 filled in the fixing groove 10 flows out to the rear side of the claws 9 through the cutout 11, and then the adhesive 12 is hardened to suppress the opening of the claws 9 after assembly of the electronic control device 100; however, depending on viscosity of the adhesive 12 to be filled, and more particularly, when the viscosity of the adhesive 12 is low, there is a possibility that the adhesive 12 flows out before the case 2 and the base 3 are bonded and bonding and sealing cannot be performed well.

So, in this embodiment 2, a protrusion portion 13 is provided on a cutout 11 which is communicated with a fixing groove 10. It is characterized in that the protrusion portion 13 has a height equal to or higher than the position of a bonding surface top portion 3a1 of a peripheral edge portion 3a of a base 3, in consideration of dimensional variation, with respect to the bonding surface top portion 3a1 of the peripheral edge portion 3a of the base 3 in the display direction of FIG. 5 at a position in a state where the base 3 is bonded to the case 2.

With this configuration, even if the maximum amount of the adhesive 12, which is filled in the fixing groove 10, flows out from the cutout 11 to the rear side of the claw 9, the adhesive 12 at a portion lower than the height of the protrusion portion 13 remains in the fixing groove 10 and comes in contact with the bonding surface top portion 3a1 of the peripheral edge portion 3a of the base 3, whereby bonding and sealing can be surely performed.

Preferred Embodiment 3

Figure 6:
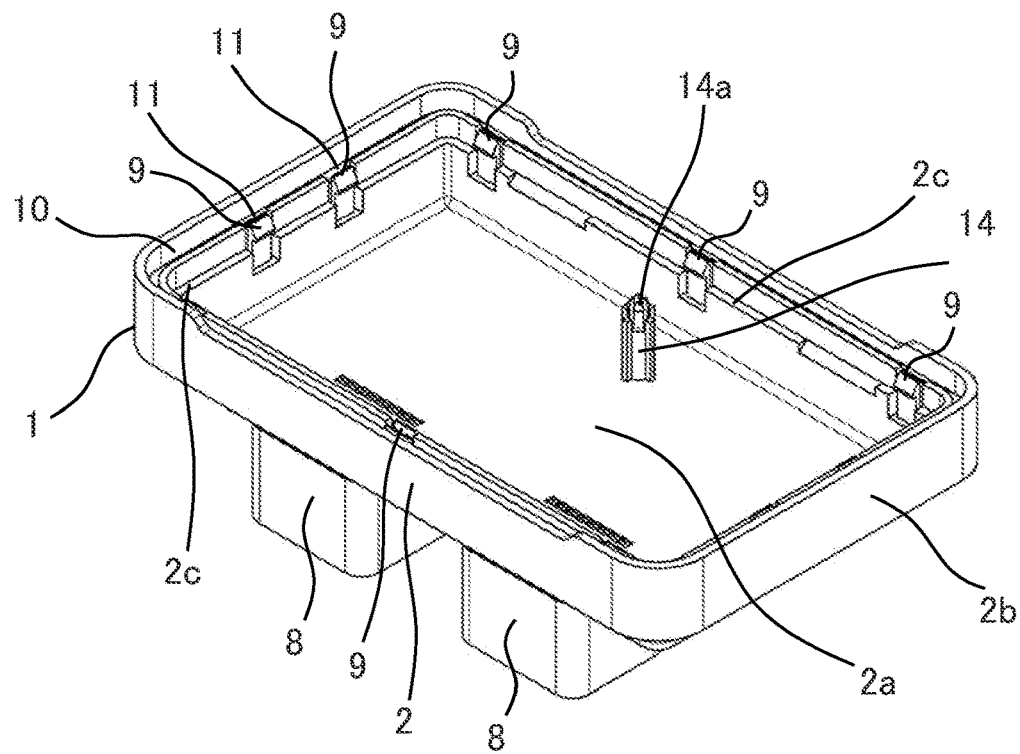
FIG. 6 is a perspective view showing a case in an electronic control device according to a preferred embodiment 3.
Figure 7:
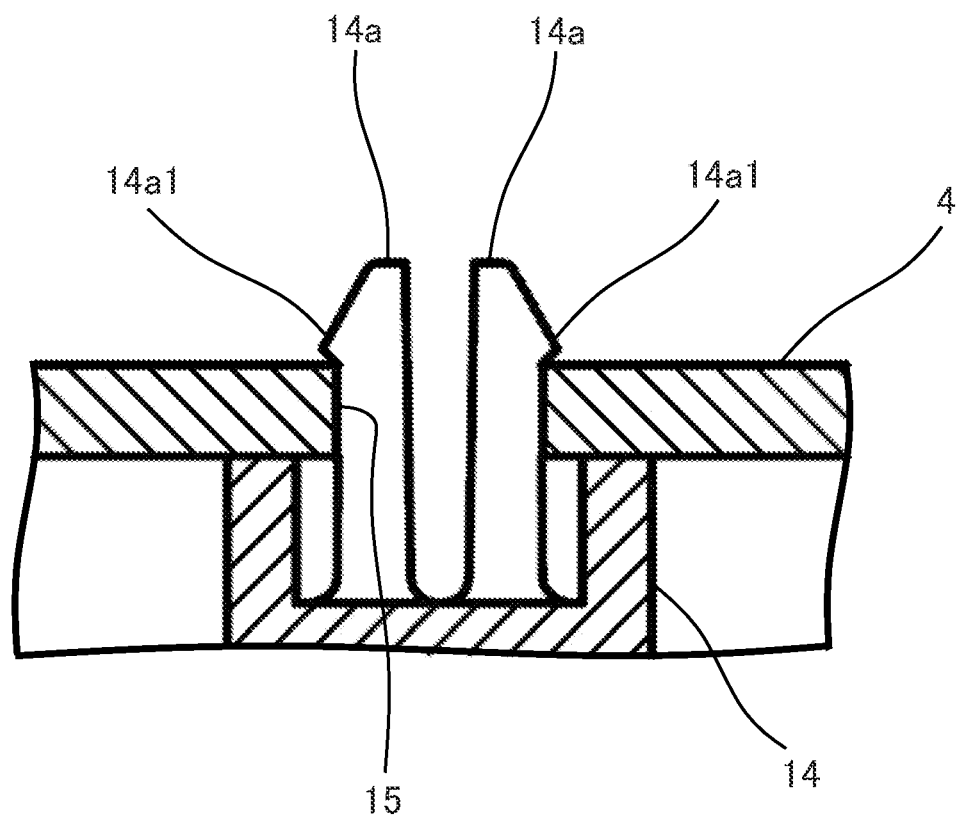
FIG. 7 is a relevant part sectional view showing the electronic control device according to the embodiment 3.

FIG. 6 is a perspective view showing a case in an electronic control device according to a preferred embodiment 3. FIG. 7 is a relevant part sectional view showing the electronic control device according to the embodiment 3.

All the methods of fixing the electronic circuit board 4 shown in the above respective embodiments are designed to hold the outer periphery of the electronic circuit board 4. However, more particularly, when the size of the electronic circuit board 4 is large, it goes without saying that it is effective for improvement in resonance point, that is, improvement in vibration resistance of the electronic circuit board 4 by providing a fixing structure also in the vicinity of the central portion of the electronic circuit board 4.

So, in this embodiment 3, a fixing structure is provided in the vicinity of the central portion of an electronic circuit board 4 in addition to the fixing structure on the outer periphery of the electronic circuit board 4 shown in the above each embodiment. A hook structure 14 provided in a projecting condition toward the electronic circuit board 4 side is provided in the vicinity of the central portion of a case base body 2a of a case 2, an engagement hole 15 is provided at a position where the hook structure 14 of the electronic circuit board 4 intersects and passes through, and the engagement hole 15 of the electronic circuit board 4 is close-fitted onto the hook structure 14, thereby fixing the vicinity of the central portion of the electronic circuit board 4.

As for the engagement of the hook structure 14 with the engagement hole 15, as shown in FIG. 7, when the engagement hole 15 of the electronic circuit board 4 is going to be close-fitted onto a pair of hooks 14a,14a of the hook structure 14, a top portion 14a1,14a1 of the pair of hook 14a,14a is bent in an inward direction to be fitted; and when the engagement hole 15 of the electronic circuit board 4 is completely fitted, the top portion 14a1,14a1 of the hook 14a, 14a is opened in the original state to be returned to fix the electronic circuit board 4.

This can improve the resonance point of the electronic circuit board 4; and consequently, the vibration resistance of the electronic control device can be further improved.

The present application describes various exemplified embodiments and examples; however, various features, aspects, and functions described in one or a plurality of embodiments are not limited to specific embodiments, but are applicable to embodiments individually or in various combinations thereof. Therefore, countless modified examples not exemplified are assumed in technical ranges disclosed in the specification of the present application. For example, there include: a case in which at least one constituent element is modified; a case, added; or a case, omitted; and a case in which at least one constituent element is extracted to combine with constituent elements of other embodiments.

The present application is suitable to actualize an electronic control device capable of improving vibration resistance.

Various modifications and alternations of this application will be apparent to those skilled in the art without departing from the scope and spirit of this application, and it should be understood that this is not limited to the illustrative embodiments set forth herein.

What is claimed is:

1. An electronic control device comprising:
    an electronic circuit board on which an electronic component is packaged; and
    a housing in which the electronic circuit board is contained, and which is composed of a case and a base,
    wherein the electronic control device includes:
    a plurality of claws which are provided on the case of the housing and which contacts and fixes an outermost edge of the electronic circuit board;
    a fixing groove which is formed in the case on a rear side of the plurality of claws, and into which a peripheral edge portion of the base is close-fitted;
    a cutout which is formed on the rear side of the plurality of claws of the housing and is communicated with the fixing groove; and
    an adhesive which is filled on the rear side of the plurality of claws via the fixing groove and the cutout to adhere to a rear side surface of each claw of the plurality of claws,
    wherein the cutout includes a protrusion portion which has a height equal to or higher than a position of a bonding surface end portion of the peripheral edge portion of the base in a state where the peripheral edge portion of the base is close-fitted into the fixing groove of the case.

2. The electronic control device according to claim 1, wherein the adhesive is filled and hardened at a viscosity of 5 to 200 Pa·s.

3. The electronic control device according to claim 1, wherein, in a state where a claw of the plurality of claws is deformed in an opening direction, stress generated at a claw base of the claw of the plurality of claws is less than a tensile strength of a material of which the claw of the plurality of claws is made.

4. The electronic control device according to claim 2,
wherein, in a state where a claw of plurality of claws is deformed in an opening direction, stress generated at a claw base of the claw of the plurality of claws is less than a tensile strength of a material of which the claw of the plurality of claws is made.

5. The electronic control device according to claim 1,
further comprising a hook structure which is provided in a vicinity of a central portion of the case of the housing; and
wherein the electronic circuit board is provided with an engagement hole which is close-fitted onto the hook structure.

6. The electronic control device according to claim 2,
further comprising a hook structure which is provided in a vicinity of a central portion of the case of the housing; and
wherein the electronic circuit board is provided with an engagement hole which is close-fitted onto the hook structure.

7. The electronic control device according to claim 3,
further comprising a hook structure which is provided in a vicinity of a central portion of the case of the housing; and
wherein the electronic circuit board is provided with an engagement hole which is close-fitted onto the hook structure.

8. The electronic control device according to claim 4,
further comprising a hook structure which is provided in a vicinity of a central portion of the case of the housing; and
wherein the electronic circuit board is provided with an engagement hole which is close-fitted onto the hook structure.

9. An electronic control device comprising:
an electronic circuit board on which an electronic component is packaged; and
a housing in which the electronic circuit board is contained, and which is composed of a case and a base,
wherein the electronic control device includes:
a plurality of claws which are provided on the case of the housing and which contacts and fixes the electronic circuit board;
a fixing groove which is formed in the case on a rear side of the plurality of claws, and into which a peripheral edge portion of the base is close-fitted;
a cutout which is formed on the rear side of the plurality of claws of the housing and is communicated with the fixing groove; and
an adhesive which is filled on the rear side of the plurality of claws via the fixing groove and the cutout to adhere to a rear side surface of each claw of the plurality of claws,
wherein the cutout includes a protrusion portion which has a height equal to or higher than a position of a bonding surface end portion of the peripheral edge portion of the base in a state where the peripheral edge portion of the base is close-fitted into the fixing groove of the case.

* * * * *